(12) United States Patent
Sprey et al.

(10) Patent No.: US 7,884,016 B2
(45) Date of Patent: Feb. 8, 2011

(54) LINER MATERIALS AND RELATED PROCESSES FOR 3-D INTEGRATION

(75) Inventors: Hessel Sprey, Kessel-Lo (BE); Akinori Nakano, Tokyo (JP)

(73) Assignee: ASM International, N.V. (NL)

( * ) Notice: Subject to any disclaimer, the term of this patent is extended or adjusted under 35 U.S.C. 154(b) by 0 days.

(21) Appl. No.: 12/370,459

(22) Filed: Feb. 12, 2009

(65) Prior Publication Data
US 2010/0200989 A1 Aug. 12, 2010

(51) Int. Cl.
*H01L 21/44* (2006.01)
(52) U.S. Cl. ............... 438/667; 438/666; 257/E21.597
(58) Field of Classification Search ......... 438/612–614, 438/666–667, 668; 257/E21.597
See application file for complete search history.

(56) References Cited

U.S. PATENT DOCUMENTS

| | | | |
|---|---|---|---|
| 4,808,273 | A | 2/1989 | Hua |
| 4,978,639 | A | 12/1990 | Hua |
| 5,998,292 | A | 12/1999 | Black et al. |
| 6,013,948 | A | 1/2000 | Akram |
| 6,176,992 | B1 | 1/2001 | Talieh |
| 6,268,660 | B1 | 7/2001 | Dhong et al. |
| 6,270,647 | B1 | 8/2001 | Graham et al. |
| 6,319,384 | B1 | 11/2001 | Taylor et al. |
| 6,319,831 | B1 | 11/2001 | Tsai et al. |
| 6,333,248 | B1 | 12/2001 | Kishimoto |
| 6,346,479 | B1 | 2/2002 | Woo et al. |
| 6,413,388 | B1 | 7/2002 | Uzoh |
| 6,433,402 | B1 | 8/2002 | Woo et al. |
| 6,458,696 | B1 | 10/2002 | Gross |
| 6,482,656 | B1 | 11/2002 | Lopatin |
| 6,492,260 | B1 | 12/2002 | Kim et al. |

(Continued)

FOREIGN PATENT DOCUMENTS

EP 1167585 1/2002

(Continued)

OTHER PUBLICATIONS

Gian et al., "High Aspect Pattern Formation by Integration of Micro Inkjetting and Electroless Plating," DTIP of MEMS & MOEMS, 6 pages, Apr. 2008.

(Continued)

*Primary Examiner*—Thanhha Pham
(74) *Attorney, Agent, or Firm*—Knobbe, Martens Olson & Bear LLP

(57) ABSTRACT

In some embodiments, a low-k dielectric film liner, preferably comprising benzocyclobutene, is deposited on the sidewalls of through-silicon vias used in three-dimensional (3-D) integration of integrated circuits. A semiconductor workpiece having a via is provided. A dielectric film liner, preferably comprising benzocyclobutene, is deposited on the sidewalls of the via by chemical vapor deposition. Following the deposition of the dielectric film liner, conductive material is deposited into the via. The conductive material on the bottom of the via can be exposed by thinning the back of the semiconductor workpiece, thereby forming a through-silicon via. The semiconductor workpiece can form a stack with one or more additional semiconductor workpieces having vias filled with conductive material to form a 3-D integrated circuit. The conductive material electrically interconnects the integrated circuits at different levels of the stack.

18 Claims, 6 Drawing Sheets

U.S. PATENT DOCUMENTS

| | | |
|---|---|---|
| 6,514,872 B1 | 2/2003 | Oikawa |
| 6,534,116 B2 | 3/2003 | Basol |
| 6,548,395 B1 | 4/2003 | Woo et al. |
| 6,566,259 B1 | 5/2003 | Ding et al. |
| 6,599,778 B2 | 7/2003 | Pogge |
| 6,620,725 B1 | 9/2003 | Shue et al. |
| 6,709,970 B1 | 3/2004 | Park et al. |
| 6,750,144 B2 | 6/2004 | Taylor |
| 6,762,076 B2 | 7/2004 | Kim |
| 6,846,725 B2 | 1/2005 | Nagarajan |
| 6,852,627 B2 | 2/2005 | Sinha |
| 6,856,025 B2 | 2/2005 | Pogge |
| 6,887,795 B2 | 5/2005 | Soininen |
| 6,897,148 B2 | 5/2005 | Halahan |
| 6,908,856 B2* | 6/2005 | Beyne et al. ............ 438/667 |
| 6,924,224 B2 | 8/2005 | Egitto |
| 6,949,456 B2 | 9/2005 | Kumar |
| 6,965,045 B2 | 11/2005 | Jung |
| 6,975,016 B2 | 12/2005 | Kellar et al. |
| 7,019,402 B2 | 3/2006 | Andry |
| 7,067,407 B2 | 6/2006 | Kostamo |
| 7,098,061 B2 | 8/2006 | Sirringhaus et al. |
| 7,109,060 B2* | 9/2006 | Fukazawa ............ 438/109 |
| 7,148,565 B2 | 12/2006 | Kim et al. |
| 7,297,641 B2 | 11/2007 | Todd et al. |
| 7,402,515 B2 | 7/2008 | Arana et al. |
| 2003/0015435 A1 | 1/2003 | Volodarsky et al. |
| 2003/0038038 A1 | 2/2003 | Basol et al. |
| 2003/0089986 A1 | 5/2003 | Gilkes et al. |
| 2003/0119311 A1 | 6/2003 | Basol et al. |
| 2004/0012090 A1 | 1/2004 | Basol et al. |
| 2006/0003566 A1 | 1/2006 | Emesh |
| 2006/0223301 A1 | 10/2006 | Vanhaelemeersch et al. |
| 2006/0252254 A1 | 11/2006 | Basol |
| 2007/0238293 A1 | 10/2007 | Basol |

FOREIGN PATENT DOCUMENTS

| | | |
|---|---|---|
| JP | 11165253 | 6/1999 |
| JP | 2000208443 | 7/2000 |
| WO | WO 01/32362 | 5/2001 |
| WO | WO 01/78135 | 10/2001 |
| WO | WO 03/009361 | 1/2003 |

OTHER PUBLICATIONS

Kawahara et al., "Highly Thermal-Stable, Plasma-Polymerized BCB Polymer Film", Plasma Sources Sci. Technol., vol. 12, pp. S80-S88 (2003).

Kawase et al., "Inkjet Printed Via-Hole Interconnections and Resistors for All-Polymer Transistor Circuits, " Advanced Materials, vol. 13, No. 21, pp. 1601-1605, Nov. 2, 2001.

Keigler et al., "Enabling 3-D Design", Semiconductor International, p. 36-44, Aug. 2007.

Lok et al., "Process Integration of inkjet Printing and Electroless Plating for LTCC Substrates," IEEE, $9^{th}$ Electronics Packaging Technology Conference, pp. 202-205, 2007.

Reid et al., "Factors Influencing Damascene Feature Fill Using Copper PVD and Electroplating." Solid State Technology, Jul. 2000, pp. 86-103.

Sakauma et al., "3D Chip-Stacking Technology with Through-Silicon Vias and Low-Volume Lead-Free Internconnections", IBM J. Res. & Dev., vol. 52, No. 6, pp. 611-622 (2008).

Sirringhaus et al., "High-Resolution Inkjet Printing of All-Polymer Transistor Circuits," Science: American Association for the Advancement of Science (AAAS), vol. 290, No. pp. 2123-2126, Dec, 15, 2000. (Downloaded from www.sciencemag.org on Aug. 27, 2008.).

Sugitani et al., "Characteristics of Organic Film Deposited by Plasma-Enhanced CVD Using BCB Resin", Electrochemical Society Proceedings, vol. 2005-01, pp. 535-546.

Tezcan et al., "A New Scaled Through Si Via with Polymer Fill for 3D Wafer Level Packaging", 2008 International Conference on Solid State Devices and Materials, Sep. 24-26, 2008.

* cited by examiner

LINER MATERIALS AND RELATED PROCESSES FOR 3-D INTEGRATION

BACKGROUND

1. Field of the Invention

This application relates generally to integration circuit fabrication. More particularly, this application relates to the deposition of liners for through-silicon vias used in the 3-D integration of integrated circuits.

2. Description of the Related Art

Integrated circuits (ICs) typically include many devices and circuit features formed on a single semiconductor wafer. Current trends in IC technology are toward faster and more powerful circuits. However, as more complex ICs such as microprocessors having high operating frequency ranges are manufactured, various speed related problems are becoming increasingly challenging. This is especially true when ICs having different functions are used to create electronic systems, for example, computing systems including processor and memory ICs, where different ICs are electrically connected by a global interconnect network. As the global interconnects become longer and more numerous in the electronic system, RC delay and power consumption as well as low system performance are becoming limiting factors.

One proposed solution to these problems is three dimensional (3-D) integration or packaging technology, where 3-D integration refers to the vertical stacking of multiple dies or wafers including ICs within a package. In 3-D integration technology, multiple wafers are electrically connected using vertical connectors or 3-D conductive structures which can have depths or widths as large as one hundred micrometers or greater. Holes or vias (known as "through-silicon vias") extending through one or more wafers can be filled with conductive material such as copper and can be aligned when the wafers are stacked to provide electrical communication among the ICs in the stacked wafers. Such 3-D integration can result in size and weight reduction of the IC package, reduction in power consumption, and an increase in performance and reliability.

A conventional method of forming an IC device using a 3-D integration technique will now be described. First, a wafer including substrate-level IC elements (e.g., transistors, capacitors, resistors, etc.) is provided. The front surface of the wafer is then coated with an insulating layer, such as a $SiO_2$ film. One or more vias are then formed by etching, drilling (e.g., laser drilling) or a like process. For 3-D integrated devices, vias can be large, with the depths ranging from twenty microns to several hundred microns. The vias are typically in the fifty micron range. For some rounded vias, the diameters can range from one micron to over one hundred microns. After via formation, a dielectric film liner is coated on the wafer surface and also inside the vias for the purpose of insulating the wafer material from subsequently deposited conductive material. The dielectric film is then lined with a barrier layer such as a Ta/TaN layer and a seed layer. The via is then filled with conductive material using an electrochemical deposition or electroplating process to form one or more conductive plugs, followed by an optional chemical mechanical polishing (CMP) process or electrochemical mechanical polishing (EMCP) process to remove any unwanted conductive material from the surface of the wafer. A metallization layer is then formed and patterned to interconnect the substrate-level IC elements to the conductive plug. To expose the conductive plug embedded in the wafer, the wafer is thinned down to reveal the conductive plug from its back surface. The wafer may then be sliced into individual dies that are aligned and capable of being stacked on top of a base wafer. Eventually more levels of dies can be stacked on top of each other.

The development of 3-D integration continues and there is a continuing need for improved methods and systems for 3-D integration.

SUMMARY

The present application provides methods and devices related to the deposition of a liner material, preferably a low-k film liner material such as a polymerizable organo-silicon compound such as a benzocyclobutene compound, using a chemical vapor deposition (CVD) process, on sidewalls of a through-silicon via. In some embodiments, a method of forming an integrated circuit device comprises providing a first semiconductor workpiece and forming one or more vias in the first semiconductor workpiece. The vias are lined with a benzocyclobutene film. Conductive material is deposited in the vias of the first semiconductor workpiece after lining the vias with the benzocyclobutene film. The conductive material in the bottom of the via can be exposed and a through-silicon via is formed. A second semiconductor workpiece having a wiring layer can be provided. The first semiconductor workpiece is stacked over the second semiconductor workpiece to form a 3-D IC device, wherein the wiring layer of the second semiconductor workpiece is electrically connected with the exposed conductive material of the through-silicon vias of the first semiconductor workpiece.

In some embodiments, a method of integrated circuit fabrication comprises providing a semiconductor workpiece with one or more vias formed therein, lining the vias with a dielectric film having a dielectric constant less than 3, and depositing conductive material in the vias after lining the vias with the dielectric film. The semiconductor workpiece is back-thinned so that the conductive material in the bottom end of the one or more vias is exposed. In some embodiments, the low-k dielectric film comprises benzocyclobutene.

In some embodiments, an integrated circuit device is provided comprising a through-silicon via in a silicon substrate, a benzocyclobutene film lining the via and a conductive fill filling the via over the benzocyclobutene film.

DETAILED DESCRIPTION

Figure 1:
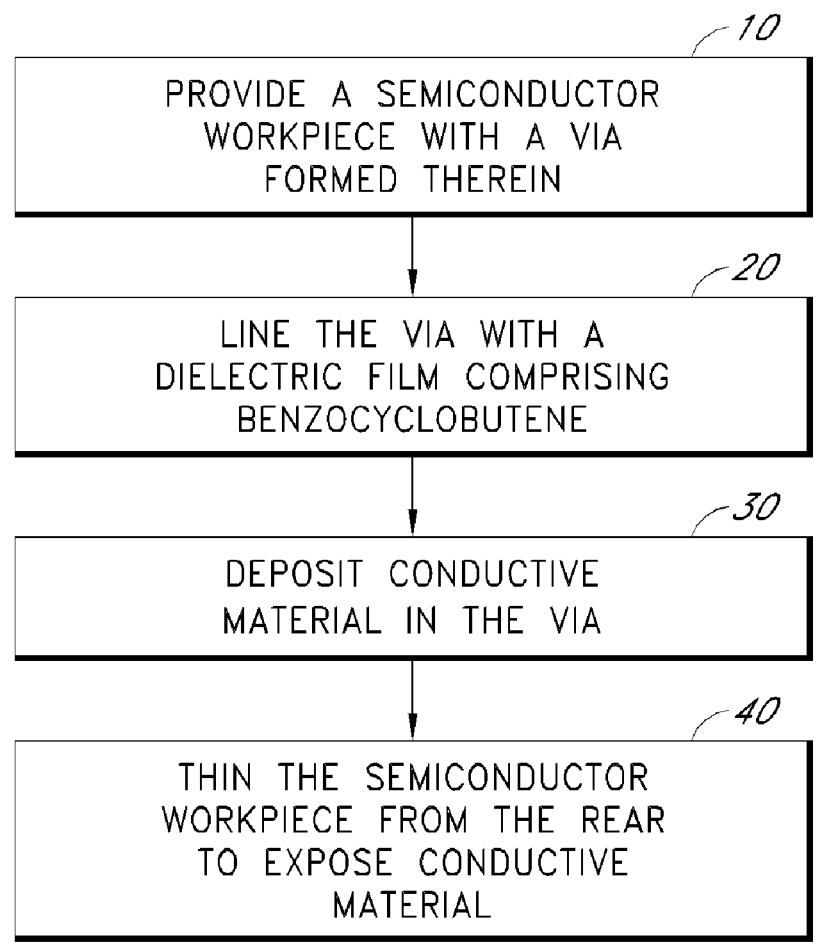
FIG. 1 is a flowchart describing a method of integrated circuit fabrication, according to some embodiments of the invention.

In forming an IC device using 3-D integration technology, the use of a dielectric film to line through-silicon vias prevents excessive capacitive coupling between vias and also prevents current from going to the wafer during some conductive material filling processes. Through-silicon vias are generally larger and possess much greater depths than conventional vias formed in integrated circuits, such as inter-level vias, which can have depths that are in the sub-micron range (e.g., about 0.15 to about 0.6 microns). Through-silicon vias, in contrast, can have depths of up to several hundred microns, although the depth is more typically in the range of about 10 to about 50 microns. The through-silicon vias can also have large widths or diameters (for circular through-silicon vias) of over one hundred microns, although the width is more typically in the range of about 1 to about 5 microns. Because of their large sizes, including being significantly wider and deeper and having larger surface areas than the vias typically formed in integrated circuits, the considerations for deposition processes for these through-silicon vias can differ from conventional processes; processes applicable to lining and filling small, conventional vias do not necessarily apply to filling the through-silicon vias of 3-D IC devices. For example, typical deposition processes may not provide adequate coverage in the deep and large through-silicon vias.

A typical dielectric film liner material is silicon oxide ($SiO_2$). Silicon oxide is a well-known dielectric material and processes for effectively and economically depositing it into vias to form through-silicon vias are well-known.

In addition to the dielectric film liner, various other liner materials can line the through-silicon vias to perform various functions. For example, barrier and stress buffer layers may also line through-silicon vias in some circumstances. Barrier layers prevent the diffusion of conductive material into the wafer. Stress buffer layers help to absorb stress caused by a mismatch in the coefficients of thermal expansion of nearby materials, such as between the conductive material (e.g., copper) and substrate material (e.g., silicon). Generally, the conductive material has a higher coefficient of thermal expansion, resulting in material stress during thermal cycling. Because through-silicon vias are very large integrated circuit structures, there can be considerable space to accommodate these various layers.

Advantageously, it has been found that polymerizable organo-silicon compounds can be used to line through-silicon vias. Such compounds include benzocyclobutenes, such as divinylalkylsiloxanebisbenzocyclobutene. These materials offer exceptional benefits as liners for through-silicon vias. The benzocyclobutene film can be deposited thinly and conformally, is "flexible" (thereby buffering the semiconductor substrate against stress caused by differential thermal expansion of the substrate and conductive material in the via), and possesses low electrical leakage characteristics. The benzocyclobutene film can also serve as a diffusion barrier. And, as benzocyclobutene is a low-k dielectric, it also results in lower capacitive coupling between nearby through-silicon vias. Utilizing a benzocyclobutene film as a dielectric film liner reduces the need for other layers that may be used in the 3-D integration of integrated circuits, such as diffusion barrier layers and thermal stress absorbing layers, and therefore, can reduce the number of processing steps used to form a 3-D integrated circuit. In addition, because of their thinness, ability to perform the function of multiple layers, and ability to be deposited in narrow, high aspect ratio vias, these polymerizable organo-silicon compounds can facilitate the use of through-silicon vias that are narrower and have a higher aspect ratio than those through-silicon vias used with conventional dielectric liners.

According to some embodiments of the invention, 3-D integrated circuit devices and methods of forming 3-D integrated circuit devices by depositing highly conformal low-k dielectric film liners for through-silicon vias are provided. In some embodiments, the low-k dielectric material will have a k value less than or equal to 4, or even less than or equal to 3. While the methods described herein can be used to deposit lining material on vias of any size involved in integrated circuit fabrication, the methods are particularly advantageous for depositing low-k dielectric film liners on the sidewalls of through-silicon vias (TSV) used in 3-D integration of integrated circuits, in which multiple die or chips including ICs are stacked vertically in a package.

Figure 3:
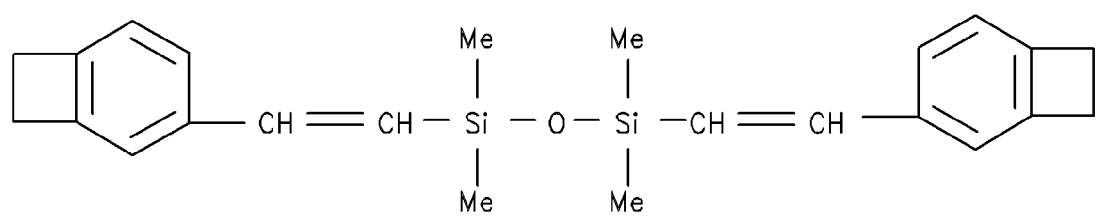
FIG. 3 illustrates the structure of divinyltetramethylsiloxanebisbenzocyclobutene.

In some embodiments, a low-k dielectric film liner having a k less than 4, more preferably less than 3, lines a through-silicon via. The preferred precursor material for the low-k liner is a polymerizable organo-silicon compound such as a benzocyclobutene compound. A preferred compound is divinylalkylsiloxanebisbenzocyclobutene, most preferable divinyltetramethylsiloxanebisbenzocyclobutene, the structure of which is shown in FIG. 3. The benzocyclobutene film can be deposited using chemical vapor deposition, more preferably plasma enhanced chemical vapor deposition (PECVD).

In some embodiments, the low-k dielectric liner, preferably formed of benzocyclobutene, has a high degree of uniformity and conformality when deposited. Film thickness uniformity is preferably determined by making multiple-point thickness measurements, e.g., by ellipsometry or cross-sectioning, determining the mean thickness by averaging the various thickness measurements, and determining the root mean square (rms) variability. To enable comparisons over a given surface area, the results can be expressed as percent non-uniformity, calculated by dividing the rms thickness variability by the average thickness and multiplying by 100 to express the result as a percentage. To determine conformality for films that overlie a stepped surface, one can measure "step coverage." Step coverage refers to the thickness uniformity of a conformal film that overlies a stepped substrate. A stepped surface is a surface that has two or more parallel components that are not disposed in the same horizontal plane. Step coverage is preferably determined by measuring the average thickness of the film at the bottom of the step, dividing it by the average thickness at the top of the step, and multiplying by 100 to express the result in percentage terms. The methods provided herein result in a dielectric film liner in a through-silicon via of a 3-D integrated circuit device having low thickness non-uniformity (e.g., 20% or less) and high step coverage (e.g., 80% or greater).

Thus, according to some embodiments, this application provides integrated circuit devices comprising a silicon substrate having a through-silicon via lined with a low-k dielectric material, preferably benzocyclobutene. The integrated circuit devices further comprise a conductive fill filling the via after lining with the benzocyclobutene film. Using benzocyclobutene as a dielectric film liner over the silicon substrate can provide a device with overall better mechanical and electrical properties than similar devices utilizing conventional film liners.

FIG. 1 is a flowchart describing a method of integrated circuit fabrication in accordance with embodiments of the present application. The flowchart describes providing 10 a semiconductor workpiece with a via formed therein, lining 20 the via with a dielectric film comprising benzocyclobutene, depositing 30 conductive material in the via after lining the via with the dielectric film and thinning 40 the semiconductor workpiece from the rear to expose the conductive material in the bottom part of the via. It will be appreciated that holes in substrates generally, other than through-silicon vias, may be lined with benzocyclobutene as disclosed herein. However, lining through-silicon vias has particular advantages, as discussed herein.

With continued reference to FIG. 1, in some embodiments, the semiconductor workpiece comprises a silicon substrate. The via is formed in the semiconductor workpiece using techniques such as masking and etching or laser drilling. The via can be annular, cylindrical or rectangular (as viewed top down).

After the semiconductor workpiece having a via is provided 10, the via is lined 20 with a low-k dielectric material, preferably a benzocyclobutene (BCB) film, as illustrated. The benzocyclobutene film can be deposited by chemical vapor deposition (CVD). The CVD process can comprise a plasma-enhanced chemical vapor deposition (PECVD), using a remotely generated plasma or a plasma generated in situ. The benzocyclobutene film is coated on the semiconductor workpiece surface and on the sidewalls of the via. After filling the via with conductive material, the conductive material in the bottom portion of the via is exposed, e.g., the semiconductor workpiece can be back-thinned, thereby forming a through-silicon via. In some embodiments, the benzocyclobutene film can help to minimize the smear of metal during the back-thinning process. In some embodiments, the through-silicon via that is formed has a width of between about 1 nm and about 5 nm and an aspect ratio greater than 3. In other embodiments, the through-silicon via that is formed has a width of between about 5 nm and about 20 nm and an aspect ratio greater than 3.

The preferred benzocyclobutene compound is divinyltetramethylsiloxanebisbenzocyclobutene. However, other organosilicon compounds or siloxanes comprising benzocyclobutene can be used. For example, one or more of the methyl groups of benzocyclobutene can be substituted with hydrogen, an ethyl or propyl group.

Using a dielectric film comprised of a low-k material such as benzocyclobutene allows for conformal liners that are thinner and have greater diffusion barrier capabilities than conventional liners such as silicon oxide liners. In some embodiments, a low-k dielectric film such as benzocyclobutene is deposited on sidewalls of the vias in addition to other layers, such as diffusion barrier layers and/or thermal stress absorption layers. In some embodiments, a low-k dielectric film such as benzocyclobutene will be the only deposited film layer between the conductive fill and the semiconductor wafer, as the benzocyclobutene film serves as an effective diffusion barrier and thermal stress absorption layer on its own.

After lining 20 the via with a benzocyclobutene film liner, conductive material is then deposited 30 into the via. The conductive material can be deposited using an electrochemical deposition process, including an electroplating or electrodeposition process. Other processes are also available for depositing conductive material, such as the ink drying method utilizing copper particles described in U.S. patent application Ser. No. 11/394,064 to Basol, filed on Mar. 29, 2006. In the ink drying method, an ink comprising conductive particles (e.g., copper) can be deposited into a via and then dried, thereby allowing conductive particles to remain in the via. One skilled in the art will appreciate that this method as well as other deposition methods may be used for depositing conductive material into the via. In some embodiments, these methods will result in the deposition of conductive material in a bottom-up fashion. Preferably, the conductive material filling the via will have little or no voids.

Examples of conductive material used for filling the via include ruthenium (Ru), copper (Cu), aluminum (Al), platinum (Pt), gold (Au) and silver (Ag). In certain embodiments, mixtures, alloys, or oxides of the foregoing materials, such as ruthenium oxide ($RuO_2$), may be used as a conductive filler. Conductive material such as Cu are prone to diffuse through liners such as silicon oxide liners and into nearby materials, such as oxide and silicon layers. A low-k dielectric liner, preferably a benzocyclobutene liner, can effectively serve as a diffusion barrier to such conductive materials.

Figure 2A:
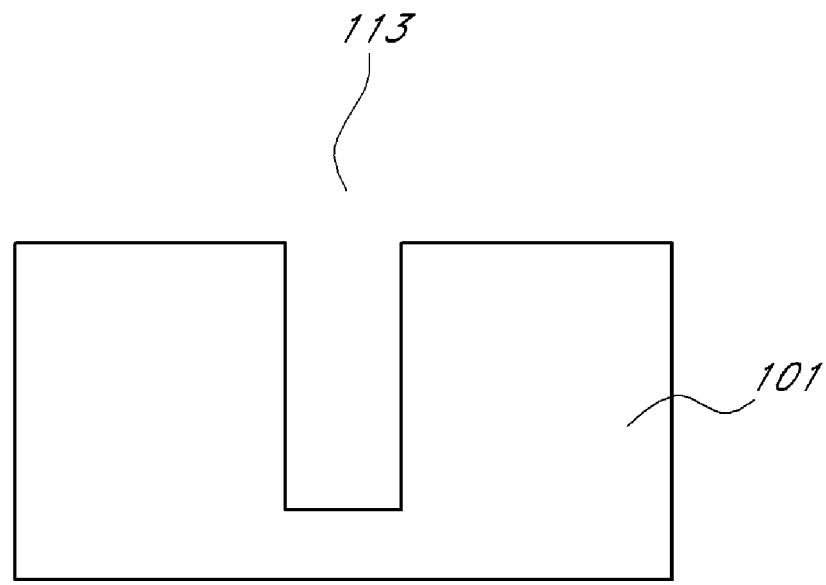
FIG. 2A illustrates a cross-sectional view of a substrate with a via formed therein, according to some embodiments of the invention.

FIGS. 2A-2F illustrate cross-sectional views of the formation of a 3-D integrated circuit device having a through-silicon via according to some embodiments of the present application. FIG. 2A illustrates a cross-sectional view of a substrate 101 with a via 113 formed therein, the via destined to be formed into a through-silicon via in a latter stage. The via 113 is formed by, e.g., etching or drilling, and can have a width of about five microns. In some embodiments, the width of the via can be much higher, such as ten microns or higher. Via 113 can have an aspect ratio (depth-to-width ratio) of about 4. In other words, the depth of via 113 is approximately 20 microns or greater, which is generally deeper than inter-level via holes in a typical integrated circuit. In some embodiments, the substrate 101 can be provided having via 113 having an aspect ratio lower than 4 (e.g., 2 or 3) or greater than 4, 5, 6 or even higher.

Figure 2B:
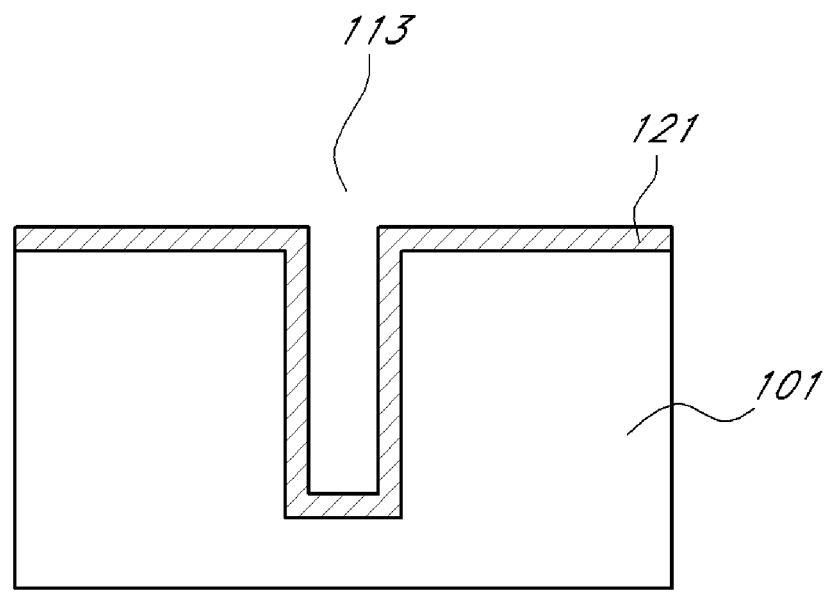
FIG. 2B illustrates the substrate of FIG. 2A after lining the substrate and via with a low dielectric liner, such as a benzocyclobutene film, according to some embodiments of the invention.

FIG. 2B illustrates the substrate 101 of FIG. 2A after lining the via 113 formed therein with a benzocyclobutene film 121. The benzocyclobutene film 121 is deposited using a plasma-enhanced CVD process at a relatively low temperature (e.g., about 400° C.). During the deposition process, benzocyclobutene is introduced with a carrier gas, such as an inert carrier gas including helium (He), neon (Ne) and/or argon (Ar). In some embodiments, the carrier gas can comprise a non-inert gas, such as hydrogen ($H_2$). The CVD process can take place in a CVD chamber, such as an Eagle® 10 or Eagle® 12 CVD reactor, available from ASM Japan K.K. of Tokyo.

Even though via 113 has a large depth and/or aspect ratio, the benzocyclobutene film 121 is capable of being deposited uniformly and conformally over via 113. Therefore, using the benzocyclobutene film 121 makes it much easier to achieve a certain minimum required thickness in the bottom of the via than with conventional $SiO_2$ lining films. The required film thickness can be in the range of between about 50 nm to about 500 nm, more typically about 100 nm to about 200 nm. As a low-k dielectric, the benzocyclobutene film 121 can also result in low levels of capacitive coupling between nearby vias.

Figure 2C:
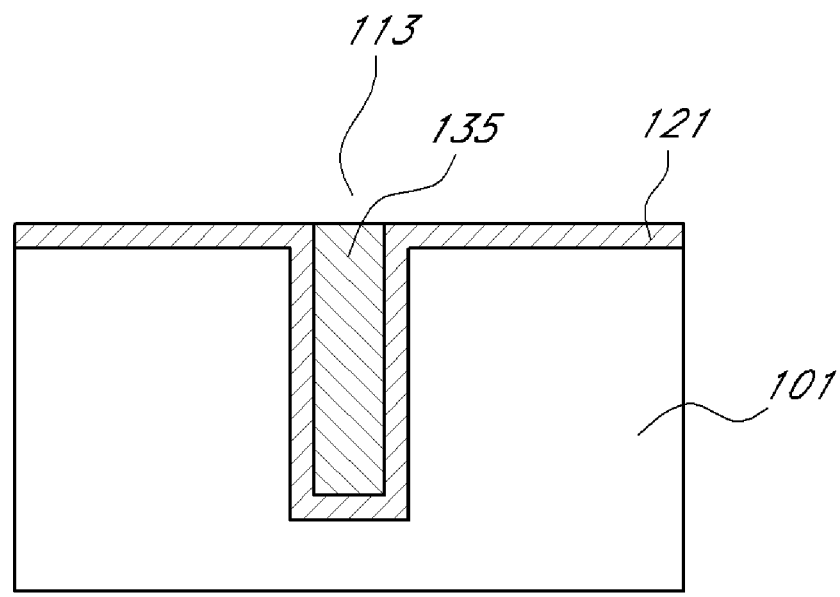
FIG. 2C illustrates the substrate of FIG. 2B after depositing a conductive material to fill the via, according to some embodiments of the invention.

FIG. 2C illustrates the substrate 101 of FIG. 2B after depositing a conductive material 135 to fill the via 113 over the benzocyclobutene film 121 to form a conductive plug in the via 113. In some embodiments, a seed layer (not shown) is provided prior to depositing the conductive material 135 into the via 113. The conductive material can be copper (Cu), which can be deposited by an electrodeposition or electroplating process in some embodiments.

The copper material 135 can fill the via 113 to its top, as shown in FIG. 2C. In some embodiments, deposition of the copper material (or other filler material) can result in excess material or "overfill" (not shown) that goes beyond the top surface of the substrate. This overfill material can be removed using a chemical mechanical polishing (CMP) process to remove the excess material from the top surface of the substrate, leaving only conductive material in the through-silicon vias. In some situations, overfill may be desired and kept.

Unlike conventional dielectric film liners, such as $SiO_2$ liners, the benzocyclobutene film 121 provides superior copper barrier capabilities, to block diffusion of the copper material 135 into the substrate 101. In addition, it has been found that the benzocyclobutene film 121 has low leakage characteristics, which is important when copper is plated, so as to prevent current from flowing into the substrate 101. The benzocyclobutene film 121 is also flexible, which is beneficial for counteracting the thermal stress caused when the silicon in the silicon substrate 101 and the copper material 135 expand differently, due to different thermal coefficients of expansion, during processing and thermal cycling during operation of the integrated circuit.

Figure 2D:
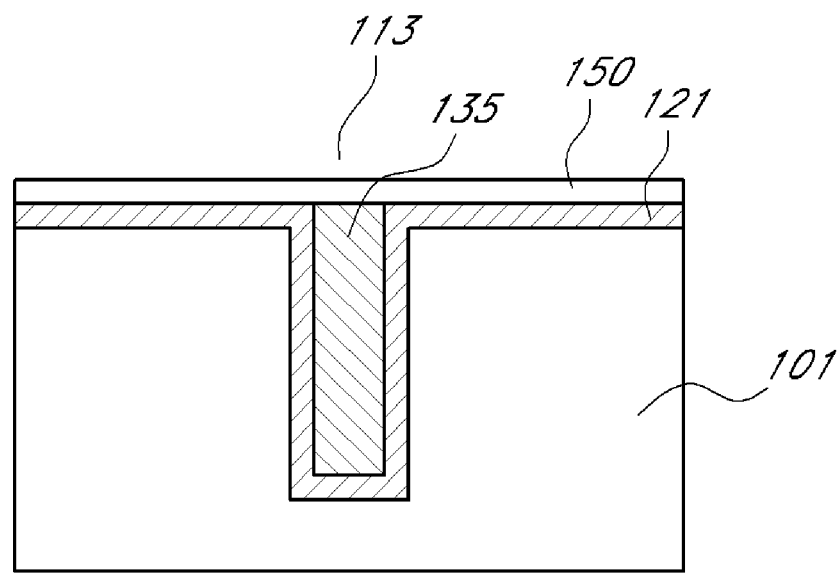
FIG. 2D illustrates the substrate of FIG. 2C after deposition of a metallization layer according to some embodiments of the invention.

With reference to FIG. 2D, after filling the via 113 of substrate 101 with copper material 135, a metallization layer 150 is formed. The metallization layer 150 assists to electrically connect IC device components horizontally to the conductive material 135 of the via 113 and is formed by various processes known in the art, including chemical vapor deposition and electrochemical deposition. In some embodiments, no additional metallization layer is needed to electrically connect IC device components horizontally. In some embodiments, the overfill from the copper material or other conductive filling material serves as the metallization layer without any additional processing (e.g., planarization). In other embodiments, the overfill from the copper material or other conductive filling material can comprise the metallization layer, but only after performing a CMP process to remove portions of unwanted material.

Figure 2E:
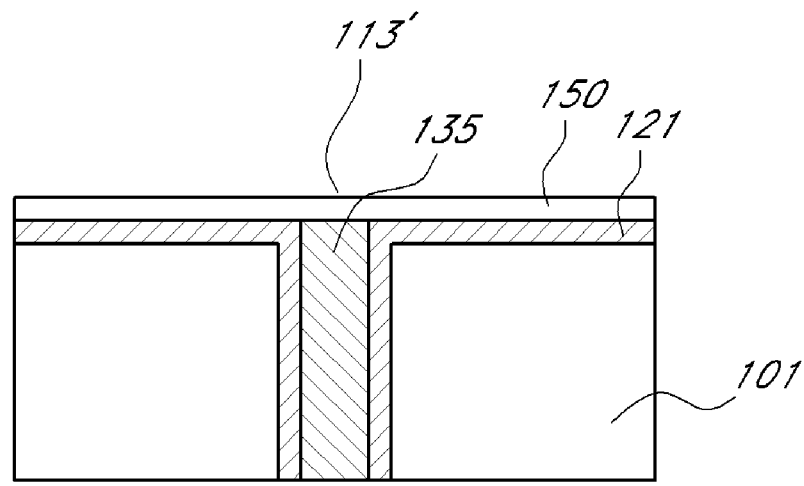
FIG. 2E illustrates the substrate of FIG. 2D after back-thinning of the substrate, according to some embodiments of the invention.

FIG. 2E shows the substrate of FIG. 2D after back-thinning, so that via 113 becomes a through-silicon via 113' and the conductive material in the bottom part of through-silicon via 113' is exposed. In some embodiments, the substrate is back-thinned using a grinding process as known in the art.

Figure 2F:
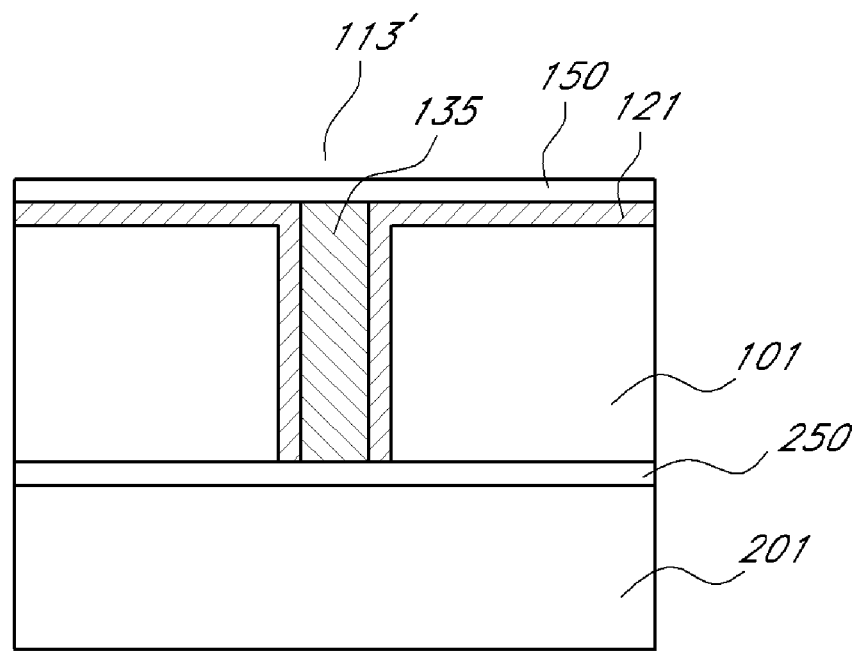
FIG. 2F illustrates the substrate of FIG. 2E after stacking on a second substrate according to some embodiments of the invention.

After back thinning the first substrate, a second substrate 201 is formed having a wiring layer 250 as shown in FIG. 2F. The second substrate 201 is processed using the same or similar techniques as applied to the first substrate 101. The wiring layer 250 may be formed by an electrodeposition process. With the conductive material 135 exposed, the first substrate 101 is stacked over the second substrate 201 as shown in FIG. 2F. The first substrate 101 may be adhered to the second substrate 201 using lead-free solder interconnects or conductive adhesives (not shown), as known in the art.

Once the first substrate is stacked over the second substrate, additional substrates having through-silicon vias and other IC substrate level devices can be stacked thereover, and electrically interconnected using through-silicon vias, resulting in an 3-D IC device having three, four, five, six, seven or more substrates. In some embodiments, the IC substrate level devices can be electrically interconnected by contacting the conductive filling material of one device with the conductive filling material of a second device.

Example A

A first semiconductor workpiece is provided in an Eagle® 10 chemical vapor deposition chamber, commercially available from ASM Japan K.K. of Tokyo. A via or opening is provided in the workpiece. The via, which is subsequently formed into a through-silicon via, has a width of between 1 and 5 microns and a depth much greater, between 10 and 50 microns.

A first benzocyclobutene film is deposited on the via using a plasma enhanced chemical vapor deposition process. The deposition of the first benzocyclobutene film takes place at a temperature between about 200° C. and about 450° C. and a pressure between about 150 and about 600 Pa. The benzocyclobutene film is introduced at a mass flow rate of between about 0.1 g/min and about 0.2 g/min. The benzocyclobutene is introduced with a carrier gas comprising He, which has a flow rate between about 300 and about 800 sccm. To generate plasma, a high RF power of between about 50 and about 300 W and a high RF frequency between about 13.56 MHz and about 27.12 MHz are provided.

Figure 4:
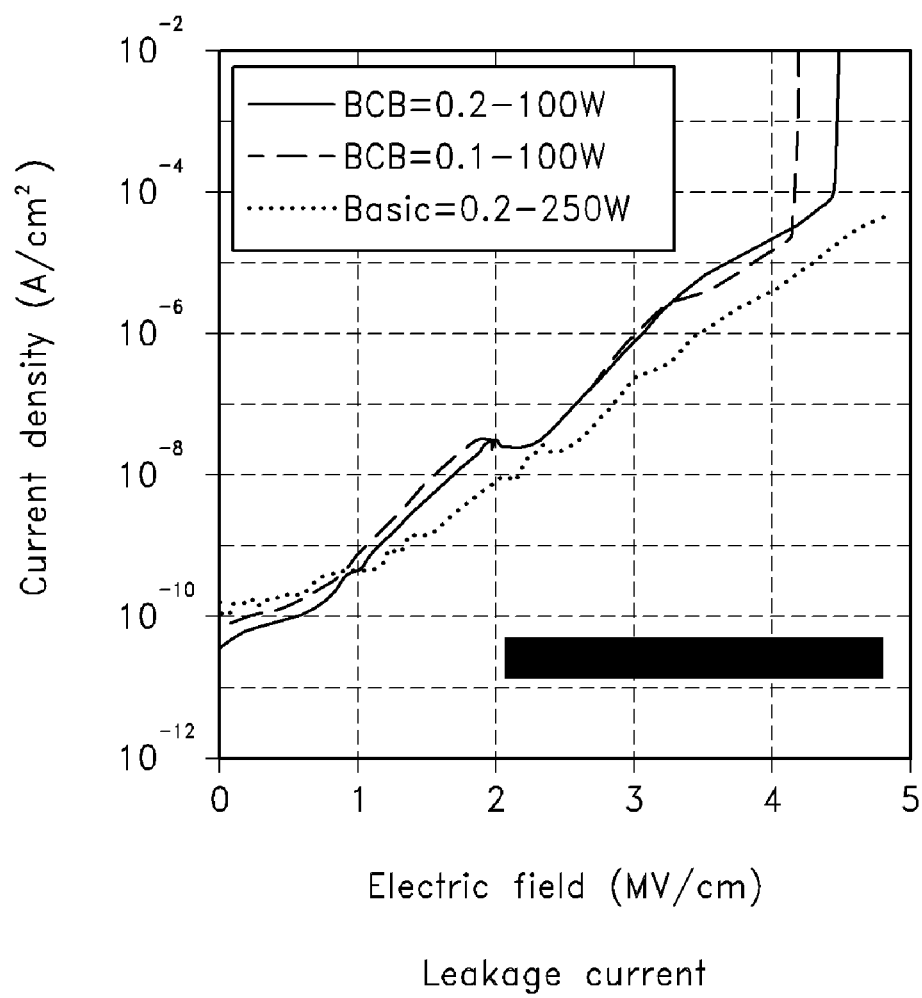
FIG. 4 illustrates a graph showing leakage current properties for BCB films, according to some embodiments of the invention.

A benzocyclobutene film is deposited that is uniform and conformal. The benzocyclotuene film has a thickness non-uniformity of about 5% or less and a step coverage of about 80% or greater. The benzocyclobutene film has a thickness of between 50 nm and 1 micron, more preferable between 100 nm and 500 nm. The benzocyclobutene film serves as an adequate diffusion barrier and thermal stress buffer, and therefore, no other film need be deposited on the benzocyclobutene film. The benzocyclobutene film also displays beneficial leakage current properties. As shown in the graph of FIG. 4, benzocyclobutene films display low leakage current properties. For example, a 200 nm benzocyclobutene film can have a leakage current density of approximately $10^{-8}$ Å/cm$^2$ in an electric field of 2 MV/cm. FIG. 4 illustrates two different process conditions used to deposit BCB liner films: a BCB flow of 0.2 g/min and power of 100 W and a BCB flow of 0.1 g/min and power of 100 W. For comparison, the leakage current for depositing BCB films for sacrificial layer applications (rather than film liners) is shown. The conditions for depositing the sacrificial layer, represented by the "Basic" line in FIG. 4, involve a BCB flow of 0.2 g/min and power of 250 W. Although the leakage current properties of the deposited BCB sacrificial layer under the "Basic" conditions was slightly better than the BCB films deposited as film liners, the step coverage was found to be better for the BCB films deposited using the first two processing conditions rather than under the "Basic" processing conditions.

Following the deposition of the benzocyclobutene film, conductive material is deposited into the via using an electrodeposition process. The back of the first semiconductor workpiece may be thinned so as to expose the conductive material in the bottom of the via and form a through-silicon via. After forming the through-silicon via with conductive material, a second semiconductor workpiece is provided. The second workpiece comprises a wiring layer, including contact pads for contacting the exposed conductive material 135 in the bottom part of vias 113 in the first semiconductor workpiece. The second semiconductor workpiece and the first semiconductor workpiece are then stacked to form a 3-D integrated circuit device. The first and second semiconductor workpieces are electrically connected by contact between the conductive material deposited in the first semiconductor workpiece and the conductive wiring layer of the second semiconductor workpiece.

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

What is claimed is:

1. A method of forming an integrated circuit device, comprising:
   providing a first semiconductor workpiece;
   forming a via in the first semiconductor workpiece;
   lining the via of the first semiconductor workpiece with a benzocyclobutene film using chemical vapor deposition, wherein the benzocyclobutene film defines an interior void in the via throughout the chemical vapor deposition;
   depositing conductive material over the benzocyclobutene film;
   exposing the conductive material in the bottom part of the via;
   providing a second semiconductor workpiece having a wiring layer and stacking the first semiconductor workpiece over the second semiconductor workpiece; and
   electrically connecting the wiring layer of the second semiconductor workpiece with the exposed conductive material in the bottom of the via of the first semiconductor workpiece.

2. The method of claim 1, wherein the via has a width greater than about 2 microns.

3. The method of claim 2, wherein the via has an aspect ratio greater than 3.

4. The method of claim 1, wherein the via is provided extending completely through the first semiconductor workpiece prior to stacking with the second semiconductor workpiece.

5. The method of claim 1, wherein the benzocyclobutene film has a step coverage of about 80% or greater.

6. The method of claim 1, wherein the benzocyclobutene film is deposited by plasma-enhanced chemical vapor deposition.

7. The method of claim 1 wherein the benzocyclobutene is divinylalkylsiloxanebisbenzocyclobutene.

8. The method of claim 7 wherein the divinylalkylsiloxanebisbenzocyclobutene is divinyltetramethylsiloxanebisbenzocyclobutene.

9. The method of claim 1, wherein exposing the conductive material in the bottom part of the via comprises back-thinning the first semiconductor workpiece.

10. The method of claim 1, wherein the wiring layer of the second semiconductor workpiece comprises a contact pad for aligning and electrically connecting the wiring layer with the exposed conductive material in the via of the first semiconductor workpiece.

11. A method of integrated circuit fabrication, comprising:
    providing a semiconductor workpiece with a through-silicon via formed therein;
    lining the via with a dielectric film having a dielectric constant less than 3 by chemical vapor deposition of a polymerizable organo-silicon compound, wherein the dielectric film defines an interior void in the via throughout the chemical vapor deposition;
    depositing conductive material in the via after lining the via with the dielectric film; and
    thinning the back of the workpiece to expose the conductive material in the bottom part of the via;
    wherein the dielectric film is the only deposited film between the conductive material and the semiconductor workpiece.

12. The method of claim 11, wherein the polymerizable organo-silicon compound comprises benzocyclobutene.

13. The method of claim 11, wherein the via has a width greater than about 2 microns.

14. The method of claim 11, wherein the via has an aspect ratio greater than 4.

15. The method of claim 11, wherein the chemical vapor deposition is plasma enhanced chemical vapor deposition.

16. The method of claim 11, wherein the conductive material comprises copper.

17. The method of claim 11, wherein the conductive material is deposited using an electrochemical deposition.

18. The method of claim 11, wherein depositing conductive material in the via is performed after lining the via with the dielectric film without an intervening etch step.

* * * * *